United States Patent [19]

Kumanoya et al.

[11] Patent Number: 4,675,850
[45] Date of Patent: Jun. 23, 1987

[54] SEMICONDUCTOR MEMORY DEVICE

[75] Inventors: Masaki Kumanoya; Kazuyasu Fujishima; Hideshi Miyatake; Hideto Hidaka; Katsumi Dosaka; Tsutomu Yoshihara, all of Itami, Japan

[73] Assignee: Mitsubishi Denki Kabushiki Kaisha, Tokyo, Japan

[21] Appl. No.: 748,722

[22] Filed: Jun. 25, 1985

[30] Foreign Application Priority Data

Aug. 30, 1984 [JP] Japan .................................. 59-183021

[51] Int. Cl.[4] ................................................. G11C 8/00
[52] U.S. Cl. ...................................... 365/230; 365/189
[58] Field of Search ............... 365/189, 193, 194, 230, 365/233

[56] References Cited

U.S. PATENT DOCUMENTS

| | | | |
|---|---|---|---|
| 4,156,938 | 5/1979 | Proebsting et al. | 365/63 |
| 4,344,156 | 8/1982 | Eaton, Jr. et al. | 365/203 |
| 4,575,825 | 3/1986 | Ozaki et al. | 365/189 |
| 4,586,167 | 4/1986 | Fujishima et al. | 365/189 |

OTHER PUBLICATIONS

IEEE Article by S. S. Eaton et al., "A 100 ns 64K Dynamic RAM using Redundancy Techniques", Technical Papers, pp. 84–85, Feb. 1981.

*Primary Examiner*—Joseph A. Popek
*Attorney, Agent, or Firm*—Lowe Price LeBlanc Becker & Shur

[57] ABSTRACT

A semiconductor memory device is operable selectively in a page mode or a nibble mode, depending upon an external mode selection signal. In the page mode of operation a row address is supplied to the memory with subsequently supplied column addresses corresponding on a one-to-one basis with data to be stored into or read from memory. In the nibble mode of operation, the memory sequentially reads from or writes to four adjacent memory cells for each column address supplied.

3 Claims, 10 Drawing Figures

SEMICONDUCTOR MEMORY DEVICE

BACKGROUND OF THE INVENTION

1. Field of the Invention

The present invention relates to a semiconductor device capable of performing high speed writing and reading operation, and particularly relates to a construction of a semiconductor memory device in which page mode operation and nibble mode operation can be selected according to an external mode designation signal.

2. Description of the Prior Art

As one of the methods for reading and writing data in a dynamic type semiconductor memory device, an operation mode called "page mode" is known. The page mode is disclosed for example in U.S. Pat. No. 4,156,938 to R. J. Proebsting et al., MOSTEK Corp., entitled "MOSFET MEMORY CHIP WITH SINGLE DECODER AND BI-LEVEL INTERCONNECT LINES", filed Dec. 29, 1975.

Figure 7:
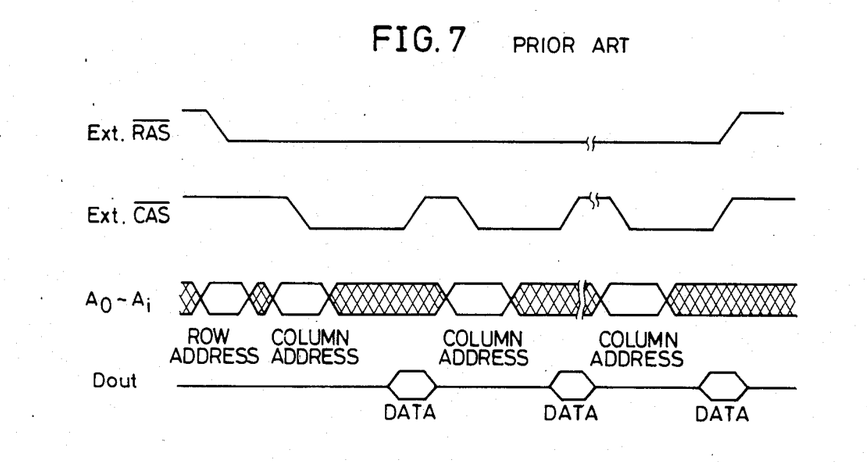
FIG. 7 is a timing chart of the signals in the device of FIG. 1 at the time of page mode operation.

FIG. 7 is a timing chart in the page mode, showing external control signals applied to a dynamic type semiconductor memory device and the read out data. Referring to FIG. 7, data reading operation in the page mode will be described in the following.

Such a semiconductor memory device receives row addresses and column addresses sequentially and therefore, in order to latch these addresses, strobe signals called $\overline{RAS}$ (row address strobe) and $\overline{CAS}$ (column address strobe) are applied respectively to the semiconductor memory device.

First, an external row address strobe signal provided from the exterior (hereinafter referred to as Ext. $\overline{RAS}$) goes into an active state at a logical level "L" (hereinafter referred to simply as "L") to enable the semiconductor memory device. The signal Ext. $\overline{RAS}$ is applied to an RAS buffer circuit. With the change of Ext. $\overline{RAS}$ to "L" serving as a trigger, an internal RAS signal (hereinafter referred to as Int. RAS) goes to "H" and is applied to an address buffer circuit from the RAS buffer circuit. With the change of the Int. RAS to "H" serving as a trigger, the address buffer circuit accepts a row address and then produces an internal row address. The internal row address is applied to a row decoder, where a single word line (row) corresponding to the row address is selected.

Subsequently, an external column address strobe signal (hereinafter referred to as Ext. $\overline{CAS}$) is brought into an active state at "L" and is applied to an internal CAS buffer circuit. An internal CAS signal (hereinafter referred to as Int. CAS) changing from "L" to "H" with the change of Ext. $\overline{CAS}$ as a trigger is applied from the internal CAS buffer circuit to the address buffer circuit. With the change of Int. CAS to "H" serving as a trigger, the address buffer circuit accepts a column address and produces an internal column address. The internal column address is applied to a column decoder, where one bit line (column) corresponding to the column address is selected. By the above described operation, one memory cell specified by the row address and the column address is selected and the data stored in this selected memory cell is read out.

Then, Ext. $\overline{CAS}$ is brought into an inactive state at "H" and an internal $\overline{CAS}$ signal (hereinafter referred to as Int. $\overline{CAS}$) outputted from the internal CAS buffer circuit changes from "L" to "H". By this Int. $\overline{CAS}$ at "H", the column decoder and the data output circuit are reset. Subsequently, Ext. $\overline{CAS}$ goes again to "L" and a new column address is accepted. A bit line corresponding to this new column address is selected and the data in a newly selected memory cell is read out. The above described operation is repeated during a period of "L" of Ext. $\overline{RAS}$. Consequently, it can be understood that the page mode is a mode in which bit lines are selected by changing only column addresses and data are successively read out of the memory cells connected to one word line since the row address is held in the same state. By this sequential operation, it is made possible to read data at high speed since it is not necessary to designate all the rows and columns. Writing of data can be made by using an input buffer circuit instead of the output buffer circuit, causing data to flow in the opposite direction.

Contrary to the above, new method for reading and writing data called "nibble mode" has been proposed recently and this nibble mode tends to be practically applied in such devices as a 64K bit dynamic RAM, 256K dynamic RAM etc. The nibble mode is disclosed for example in "A 100 ns 64K Dynamic RAM using Redundancy Techniques" by S. S. Eaton, S. S. Shefield et al., Inmos Cop., ISSCC Dig. of Technical Papers, page 84–page 85, February, 1981 or in U.S. Pat. No. 4,344,156 to S. S. Eaton Jr., D. R. Wooten, Inmos Corp., entitled "High Speed Data Transfer for a Semiconductor Memory", filed Oct. 10, 1980.

Figure 8:
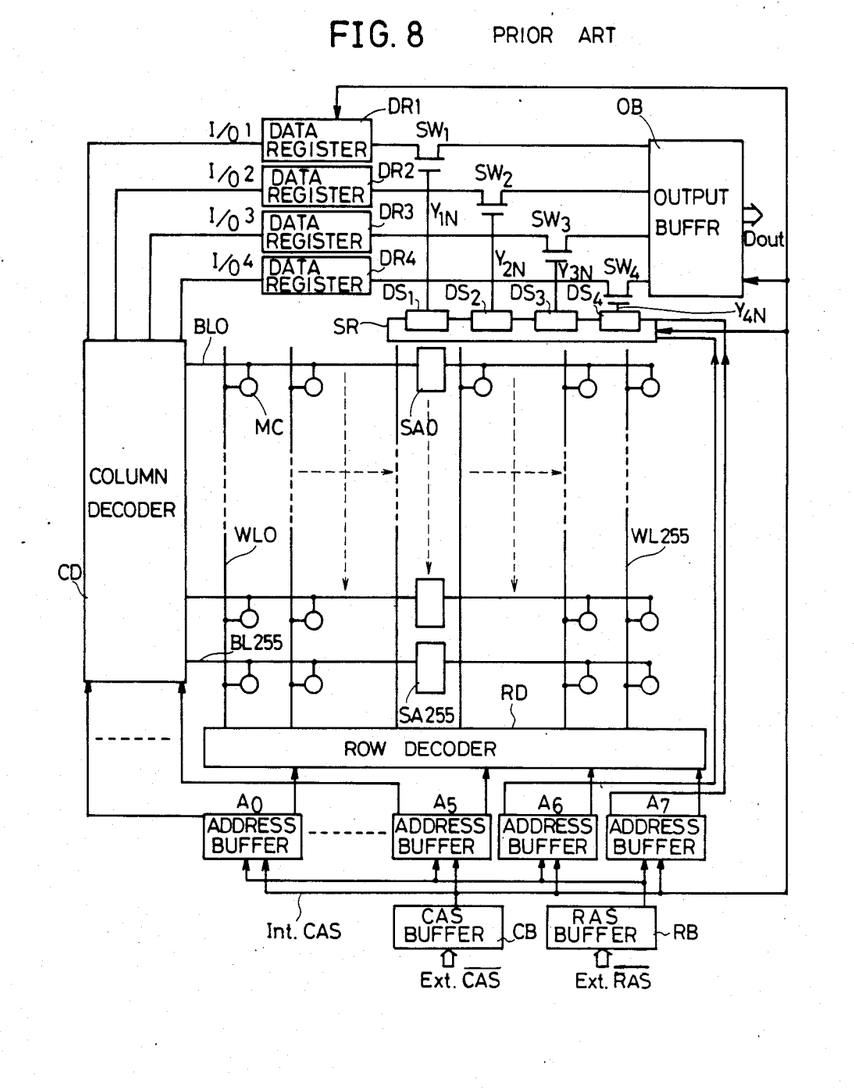
FIG. 8 is a block diagram showing a construction of a semiconductor device in which nibble mode operation can be performed.

FIG. 8 shows an example of a construction of a 64K bit dynamic RAM in which nibble mode operation can be effected. Referring to FIG. 8, the construction of the RAM will be described specifically in connection with a memory portion, a word line selecting system, a bit line selecting system and a data output system.

The memory portion includes 256 word lines WL0 to WL255 and 256 bit lines BL0 to BL255. Corresponding to each point of intersection between a word line and a bit line, one memory cell MC is provided, the respective memory cells being connected with the associated word lines and bit lines. The memory portion is divided into two sections each including 32K bits. At the center of the memory portion, sense amplifiers SA0 to SA255 for amplifying data bits are connected to the bit lines BL0 to BL255, respectively.

The word line selecting system comprises: an RAS buffer circuit RB for applying the Int. RAS to each of the address buffer circuits A0 to A7 upon receipt of the signal Ext. $\overline{RAS}$; address buffer circuits A0 to A7 for receiving a row address in response to the Int. RAS so as to apply a row address signal to a row decoder; and the row decoder RD for decoding the row address signal from the address buffer circuits A0 to A7 so as to select a word line corresponding to the row address signal.

The bit line selecting system comprises: a CAS buffer circuit CB for applying the Int. CAS to the address buffer circuits A0 to A7 upon receipt of the signal Ext. $\overline{CAS}$; address buffer circuits A0 to A5 for receiving a column address upon receipt of the Int. CAS so as to apply a column address signal to a column decoder CD; and the column decoder CD for decoding the column address signal received from the address buffer circuits A0 to A5 so as to select simultaneously four bit lines.

The data output system comprises: data registers DR1 to DR4 for holding the four bit data, each by one bit, selected by the column decoder CD through the corresponding sense amplifiers, column decoder CD and signal lines I/O1 to I/O4; and an output buffer circuit OB for serially applying the signals received from the data registers to an external apparatus. In the paths connecting the data registers DR1 to DR4 with the output buffer circuit OB, switches SW1 to SW4 each comprised of a field-effect transistor are provided respectively. The gate electrodes of the transistor switches SW1 to SW4 are connected respectively via signal lines $Y_{1N}$ to $Y_{4N}$ to data selectors DS1 to DS4 which control the states of the switches SW1 to SW4 respectively. The data selectors DS1 to DS4 form a shift register SR. To the shift register SR constructed by the data selectors DS1 to DS4, the signals from the address buffer circuits A6 and A7 are applied so that the data corresponding to the signals are selected. As a result, the switches corresponding thereto are selected to be turned on so that the data stored in the corresponding data registers are read out. The signal Int. CAS from the CAS buffer circuit CB is also applied to the data registers DR1 to DR4, the shift register SR and the output buffer circuit OB so as to control the operation timing of the respective circuits.

Figure 9:
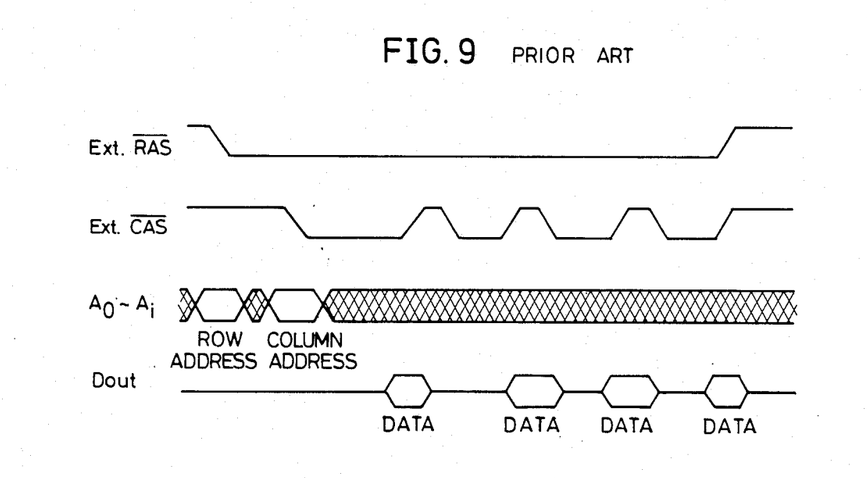
FIG. 9 is a timing chart of the signals in the device of FIG. 1 at the time of nibble mode operation.

FIG. 9 is an operation timing chart concerning external control signals and data read out in the nibble mode in a semiconductor memory device of FIG. 8. In the following, the nibble mode operation will be described with referring to FIGS. 8 and 9.

First, the signal Ext. ovs/RAS/ goes to "L" so that the RAS buffer circuit RB is enabled. With the change of Ext. $\overline{RAS}$ to "L" serving as a trigger, the Int. RAS outputted from the RAS buffer circuit RB changes from "L" to "H". With the change of Int. RAS from "L" to "H" serving as a trigger for the address buffer circuits A0 to A7, the row address signal is accepted in the address buffer circuits A0 to A7 and the row decoder RD so that a word line corresponding thereto is selected among the 256 word lines WL0 to WL255.

Subsequently, the signal Ext. $\overline{CAS}$ goes to "L" and this change to "L" serves as a trigger to enable the CAS buffer circuit CB. As a result, the Int. CAS outputted therefrom changes from "L" to "H". In synchronism with Int. CAS to "H", the address buffer circuits A0 to A7 are activated to receive the column address signal. The output signals from the address buffer circuits A0 to A5 are applied to the column decoder CD so that the column decoder CD selects simultaneously along the 256 bit lines BL0 to BL255, four successive bit lines corresponding to the column address signals from the buffer circuits A0 to A5. By the above described operation, four memory cells are selected and the data in the selected memory cells are applied to the data registers DR1 to DR4 via the sense amplifiers, the column decoder CD and the signal lines I/O1 to I/O4. The data registers DR1 to DR4 hold respectively the data applied thereto. At this time, Int. CAS is also applied to the shift register SR and the output buffer circuit OB, which are in the enabled state. The signals from the address buffer circuits A6 and A7 is applied to the shift register SR so that data selectors corresponding thereto are selected and the corresponding transistor switches are in ON state. As a result, the data stored in the data registers connected to the conducted switches are provided through the output buffer circuit OB.

Then, as shown in FIG. 9, in the state of Ext. $\overline{RAS}$ at "L", the signal Ext. $\overline{CAS}$ is first brought into "H" and then brought again to "L". In consequence, the shift register SR operates so that the first selected and conducted switch is brought into the non conductive state and a succeeding switch is conducted. For example, if only the switch SW1 is first selected and conducted by the data selector DS1 in response to the signal from the address buffer circuits A6 and A7, the switch SW1 is then brought into the non conductive state and only the switch SW2 is conducted. By repeating this operation, the shift register SR operates independent of an external address, and the first selected four-bit data are successively read out.

Thus, in the nibble mode, Ext. $\overline{CAS}$ changes in the sequence of "H"→"L"→"H"→"L" with Ext. $\overline{RAS}$ being held at "L", whereby the data stored in the data registers DR1 to DR4 are successively read out. Writing of data can be made by using an input buffer circuit instead of the output buffer circuit, causing data to flow in the opposite direction.

As described above, in the nibble mode, differing from the page mode, there is no need to designate a column address each time for selection of a bit line and data can be read out at higher speed than in the page mode. However, the nibble mode has a disadvantage that only the first selected four-bit data can be read out.

Thus, although operation in a semiconductor memory device in the page mode is substantially different from that in the page mode as described above, the timing of Ext. $\overline{RAS}$ and that of Ext. $\overline{CAS}$ are entirely the same in the two modes as can be seen from FIGS. 7 and 9, and therefore, it is possible to support only either of the two modes in a conventional semiconductor memory device since it cannot identify its operating mode.

SUMMARY OF THE INVENTION

Therefore, a principal object of the present invention is to provide a semiconductor memory device capable of performing operation both in the page mode and the nibble mode, by which the above stated disadvantages of a conventional semiconductor memory device can be overcome.

Briefly stated, the present invention is a semiconductor memory device in which page mode operation and nibble mode operation can be performed in the same semiconductor device by applying a mode switching signal for selection between the page mode and the nibble mode and "continual nibble mode" operation with the nibble mode and the page mode being selected alternately in a period of "L" of Ext. $\overline{RAS}$ can be performed by suitably controlling a mode switching signal.

A concrete construction of the present invention includes a page/nibble switching signal generating circuit for generating a signal designating an operation mode and first and second CAS buffer circuits, in addition to a semiconductor memory device where the conventional nibble mode can be selected.

The first CAS buffer circuit receives and inverts a signal Ext. $\overline{CAS}$ to generate a signal CAS1, which is applied to a page/nibble switching signal generating circuit, data selecting shift registers for selecting data register for storing data and an output buffer circuit.

The page/nibble switching signal generating circuit receives signals $\overline{RAS}$ and CAS1 generated in synchronism with a signal Ext. $\overline{NM}$ provided from the exterior for designating a mode and a signal Ext. $\overline{RAS}$ from the RAS buffer circuit. Upon receipt of the above stated signals, the page/nibble selection signal generating circuit generates a signal $\overline{NM}$ synchronizing with Ext. $\overline{NM}$ and a signal $\overline{CASC}$ rising with CAS1 as a trigger and falling with $\overline{RAS}$ as a trigger, so that the signals thus generated are applied to the second CAS buffer circuit.

The second CAS buffer circuit includes at the first stage, an OR gate for receiving the signals $\overline{NM}$ and $\overline{CASC}$ and a NAND gate for receiving the output from the OR gate and the signal Ext. $\overline{CAS}$. As the signals from the second CAS buffer circuit, the signal CAS2 from the NAND gate and a signal $\overline{CAS2}$ obtained by inverting the CAS2 are applied to the address buffer circuit, the column decoder and the data registers so as to serve as operation timing signals for the respective circuits.

With such construction, when Ext. $\overline{NM}$ is at "L", reading (or writing) of data for one RAS cycle is in the nibble mode, in which the first selected four-bit data are successively read (or written), independent of the change of Ext. $\overline{CAS}$. When the Ext. NM is at "H", the column decoder and other circuits are repeatedly set and reset for one RAS cycle according to the change of Ext. $\overline{CAS}$ to perform page mode operation. Accordingly, an operation mode can be selected according to Ext. $\overline{NM}$ and it is made possible not only to perform operation in both modes in the same semiconductor memory device, but also to perform "continual nibble mode operation" by suitably controlling Ext. $\overline{NM}$.

These objects and other objects, features, aspects and advantages of the present invention will become more apparent from the following detailed description of the present invention when taken in conjunction with the accompanying drawings.

DESCRIPTION OF THE PREFERRED EMBODIMENT

Referring to the drawings, a preferred embodiment of the present invention will be described in the following.

Figure 1:
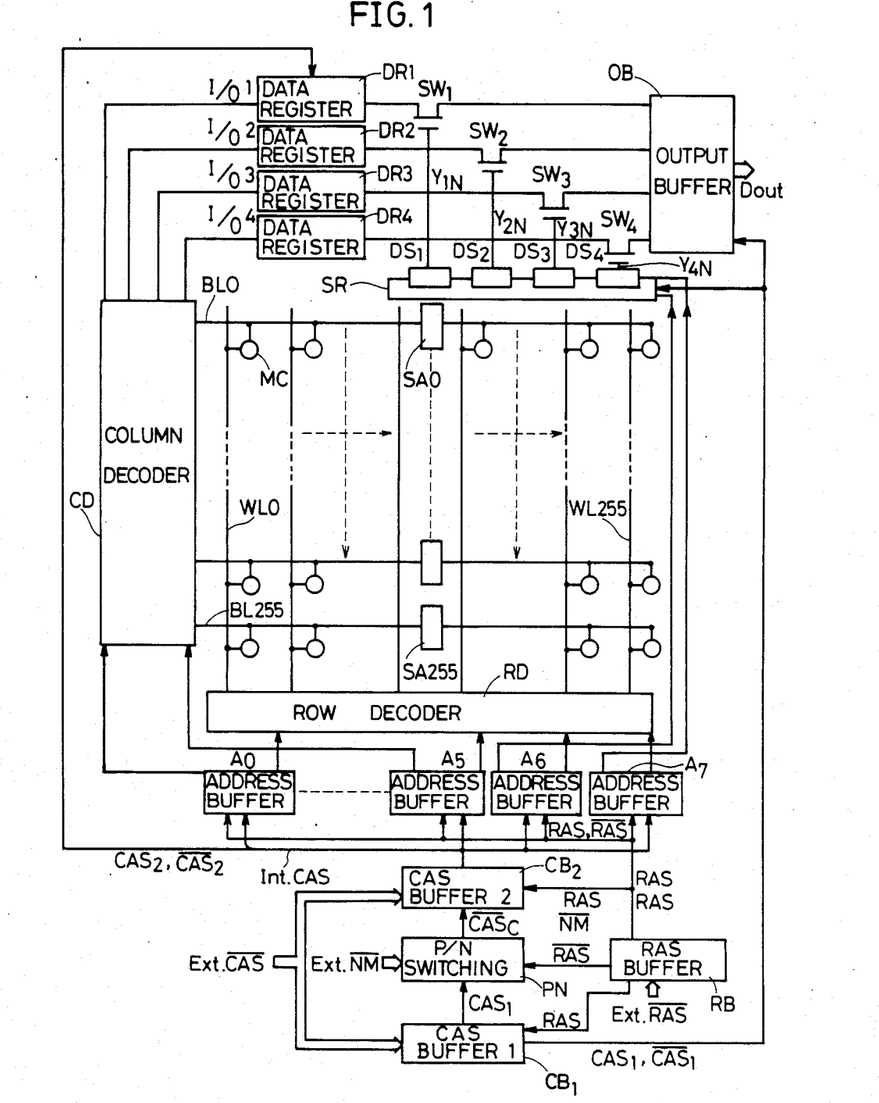
FIG. 1 is a block diagram of a semiconductor memory device in accordance with the present invention in which page mode operation and nibble mode operation can be performed.

FIG. 1 is a block diagram showing a construction of a semiconductor memory device comprising a 64K bit dynamic RAM in accordance with an embodiment of the present invention. As is different from the conventional semiconductor memory device shown in FIG. 8, a semiconductor memory device in accordance with the present invention comprises two CAS buffer circuits CB1 and CB2 for receiving the signal Ext. $\overline{CAS}$, and a page/nibble switching signal generating circuit PN for applying the signals $\overline{NM}$ and $\overline{CASC}$ for selection of the nibble mode and the page mode to the CAS buffer circuit CB2 upon receipt of the signal Ext. $\overline{NM}$ applied from the exterior for designating a mode and the signals RAS and $\overline{RAS}$ from the RAS buffer circuit RB.

The CAS buffer circuit CB1 has entirely the same construction as that of a conventional CAS buffer circuit in a memory device where page mode operation can be performed. The signals CAS1 and $\overline{CAS1}$ from the CAS buffer circuit CB1 are applied to the shift register SR and the output buffer circuit OB so as to control the operation timing of these circuits.

The output CAS 1 from the CAS buffer circuit CB1 is also applied to the page/nibble switching signal generating circuit PN.

Figure 2:
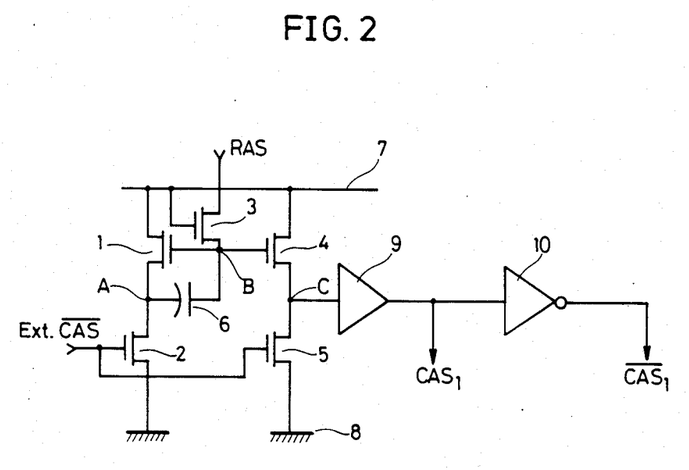
FIG. 2 is a diagram showing an example of a construction of the first CAS buffer circuit CB1 shown in FIG. 1.

FIG. 2 shows an example of a construction of the CAS buffer circuit CB1, the circuits not related to the description of the present invention being omitted from illustration. Referring to FIG. 2, the CAS buffer circuit CB1 comprises N channel MOS transistors 2 and 5 for receiving Ext. $\overline{CAS}$ at the gate electrodes thereof, N channel MOS transistors 1 and 4 each having one of the conductive regions connected to a power supply line 7 and an N channel MOS transistor 3 having one of the conductive regions receiving RAS and a gate electrode connected to the power supply line 7. The transistors 1 and 2 are connected in series via a node A and the transistors 4 and 5 are connected in series via a node C. A resistance ratio (a physical size ratio) between the transistors 1 and 2 and a resistance ratio between the transistors 4 and 5 are set so that the circuit operates stably. The other conductive region of the transistor 3 and the gate electrodes of the transistors 1 and 4 are connected via a node B. Between the node A and the node B, a bootstrap capacitor 6 is connected to assure high speed operation and to make stable the output levels. An output signal from the node C is amplified by the amplifier 9, through which a signal CAS1 is provided. The signal from the amplifier 9 is inverted by the inverter 10, which provides an output $\overline{CAS1}$.

In such construction, when RAS is at "H", Ext. $\overline{CAS}$ is always inverted and provided through the node C to the amplifier 9. When RAS is at "L", Ext. $\overline{CAS}$ is always at "H" and the output signal from the node C is at "L". Thus, CAS1 is a signal synchronizing with Ext. $\overline{CAS}$ and having the inverted phase, while $\overline{CAS1}$ is a signal synchronizing with Ext. $\overline{CAS}$ and having the same phase.

Figure 3A:
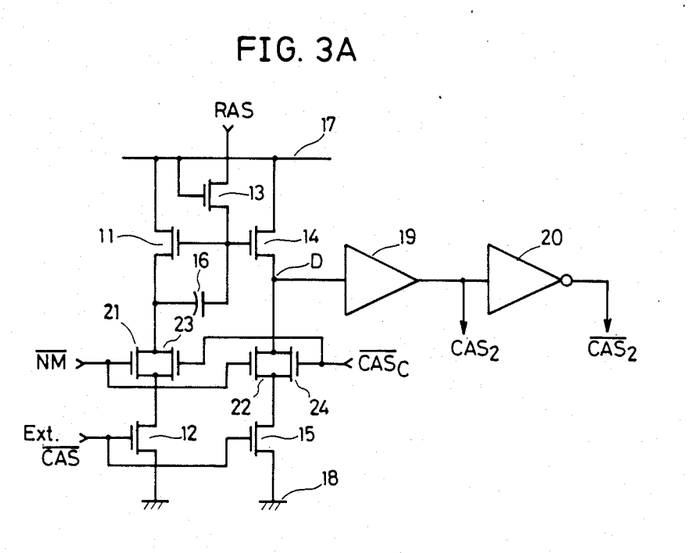
FIG. 3A is a diagram showing an example of a construction of the second CAS buffer circuit CB2 shown in FIG. 2.

FIG. 3A shows an example of a construction of the CAS buffer circuit CB2 which characterizes the present invention.

Figure 3B:
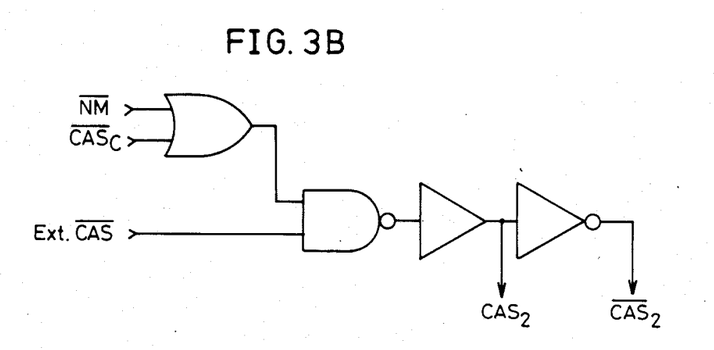
FIG. 3B is a diagram showing the circuit construction of FIG. 3A in logic symbols.

FIG. 3B shows the circuit of FIG. 3A in logic symbols.

Referring to FIG. 3A, the set of N channel MOS transistors 21 and 23 and the set of N channel MOS transistors 22 and 24 form respectively OR circuit for $\overline{NM}$ and for $\overline{CASC}$. The N channel MOS transistor 12 is connected in series with the transistors 21 and 23, and the N channel MOS transistor 15 is connected in series with the transistors 22 and 24. The N channel MOS transistors 11, 13, 14 and the bootstrap capacitor 16 are the same in a circuit arrangement as the transistors 1, 3, 4 and the bootstrap capacitor 6 shown in FIG. 2. To the gate electrodes of the MOS transistor 21 and 22, the signal $\overline{NM}$ for designating a high speed operation mode (the page or nibble mode) is applied. To the gate electrodes of the MOS transistors 23 and 24, the signal $\overline{CASC}$ for designating a common operation mode or a high speed operation mode (the page or nibble mode) is applied. To the gate electrodes of the transistors 12 and 15, the signal Ext. $\overline{CAS}$ is applied. The output from the node D becomes the signal CAS2 through the amplifier 19, and the signal CAS2 applied to the inverter 20 becomes the signal $\overline{CAS2}$. In the circuit construction shown in FIG. 3A, the operation as shown by logic in FIG. 3B is performed with RAS at "H", as described afterwards. The output signals CAS2 and $\overline{CAS2}$ serve to control the operation timing of the address buffer circuits A0 to A7, the column decoder CD and the registers DR1 to DR4. The signals $\overline{CASC}$ and $\overline{NM}$ for designating an operation mode are generated by the page/nibble switching signal generating circuit PN.

Figure 4:
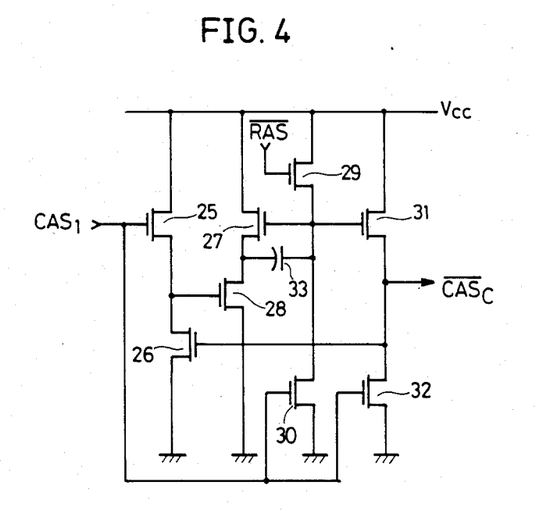
FIG. 4 is a diagram showing a construction of a $\overline{CASC}$ signal generating circuit in the page/nibble switching signal generating circuit shown in FIG. 1.

FIG. 4 shows an example of a circuit construction for providing the signal $\overline{CASC}$ in the page/nibble switching signal generating circuit in accordance with the present invention. Referring to FIG. 4, the transistors used in this circuit are all N channel MOS transistors. The circuit comprises transistors 25, 30 and 32 for receiving at the gate electrodes the signal CAS1 from the CAS buffer circuit CB1 and a transistor 29 for receiving at the gate electrode thereof the signal $\overline{RAS}$ from the RAS buffer circuit RB. The transistors 25 and 26 are connected in series. Similarly, the transistors 27 and 28, the transistors 29 and 30, and the transistors 31 and 32 are respectively connected in series. To point connecting the transistors 25 and 26 is coupled the gate of the transistor 28, while the point connecting the transistors 31 and 32 is coupled the gate of the transistor 26. The gates of the transistors 27 and 31 both are coupled to the point connecting the transistors 29 and 30. In order to assure high speed operation of the circuit and to make stable the output levels, a bootstrap capacitor 33 is provided between the connecting point of the transistors 27 and 28 and the connecting point of the transistors 29 and 30 (namely, the connecting point of the gates of the transistors 27 and 31). Vcc denotes a power supply voltage. The signal $\overline{CASC}$ is provided from the connecting point of the transistors 31 and 32.

In the circuit construction shown in FIG. 4, the output signal $\overline{CASC}$ from the connecting point of the transistors 31 and 32 falls to "L" with timing in which the change of the signal CAS1 from the first CAS buffer circuit CB1 to "H" serves as a trigger, and the signal $\overline{CASC}$ rises to "H" with timing in which the change of the signal $\overline{RAS}$ from the RAS buffer circuit RS to "H" serves as a trigger. More specifically, a period of "L" of $\overline{CASC}$ corresponds to one cycle of the operation mode. Such timing will be described in more detail afterwards.

Figure 5:
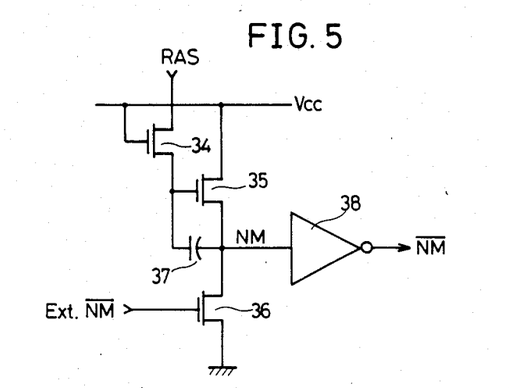
FIG. 5 is a diagram showing a construction of an $\overline{NM}$ generating circuit in the page/nibble switching signal generating circuit.

FIG. 5 shows a circuit for providing a mode designating signal $\overline{NM}$ included in the page/nibble switching signal generating circuit PN in accordance with the present invention. Referring to FIG. 5, the $\overline{NM}$ generating circuit comprises an N channel MOS transistor 36 having a gate electrode for receiving the signal Ext. $\overline{NM}$ and an N channel MOS transistor 34 having a gate electrode for receiving a power supply voltage $V_{cc}$ and one of the conductive regions for receiving the signal RAS from the RAS buffer circuit RB. It further comprises an N channel MOS transistor 35 and a bootstrap capacitor 37. The transistor 35 is connected in series with the transistor 36, and the gate electrode of the transistor 35 is connected to the other conductive region of the transistor 34. The bootstrap capacitor 37 is connected between the connection point of the transistors 35 and 36 and the gate electrode of the transistor 35. The output NM from the connection point of the transistors 35 and 36 is inverted by the inverter 38, which provides an output $\overline{NM}$. In this circuit construction, the input signal Ext. $\overline{NM}$ synchronizes with the output signal $\overline{NM}$ and these signals are the same in phase. The signal Ext. $\overline{NM}$ at "L" designates the nibble mode, while the signal Ext. $\overline{NM}$ at "H" designates the page mode.

Figure 6:
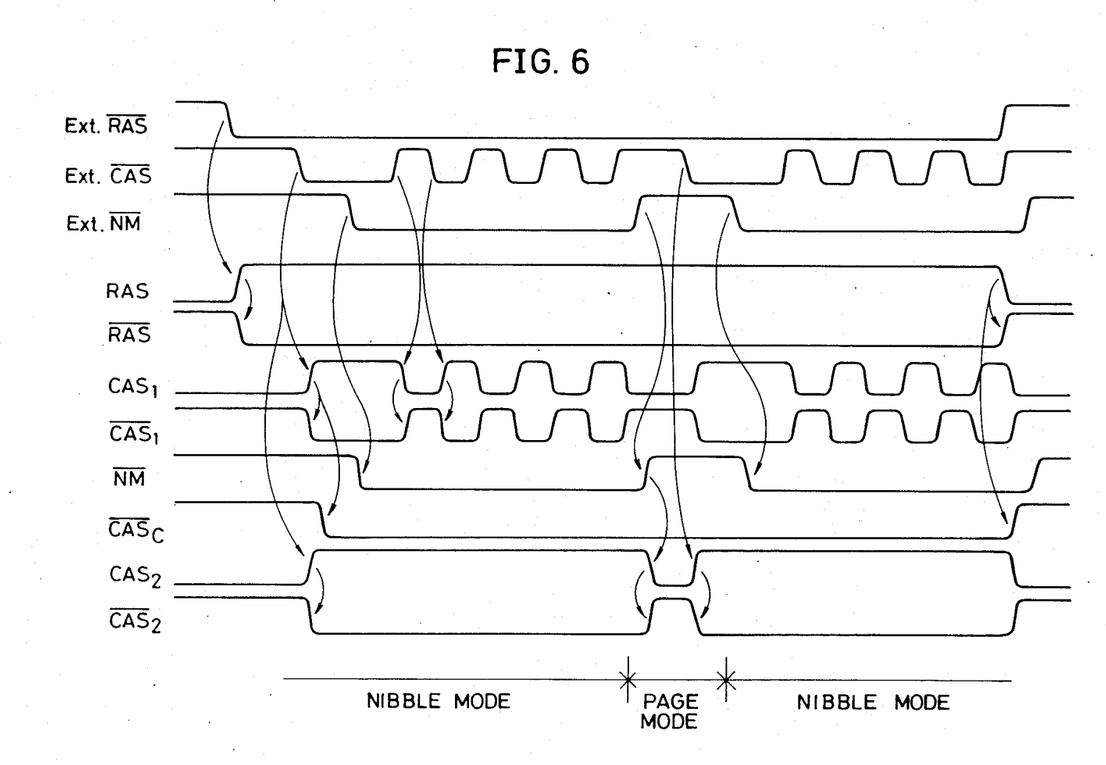
FIG. 6 is a timing chart of internal signals generated in the semiconductor memory device shown in FIG. 1.

FIG. 6 shows timing of the external signals Ext. $\overline{RAS}$, Ext. $\overline{CAS}$ and EXt. $\overline{NM}$ and the output signals from the buffer circuits CB1, CB2 and RB and the switching signal generating circuit PN. In FIG. 6, the arrows represent the signals serving as a trigger. In the following, the operation of the respective circuits at the time of reading data will be described with reference to FIGS. 1 to 6.

First, the signal Ext. $\overline{RAS}$ changes from "H" to "L" so that the semiconductor memory device is brought into the enabled state. Since the RAS buffer circuit RB receives Ext. $\overline{RAS}$ and inverts its phase, the output signal RAS from the RAS buffer circuit RB synchronizes with Ext. $\overline{RAS}$, but is inverted in phase. When the signal RAS goes to "H", the node B in the CAS buffer circuit CB1 shown in FIG. 2 is charged via the transistor 3 up to "H" (the bootstrap capacitor 6 is also charged up). When the voltage at the node B goes to "H", the voltage of the gates of the transistors 1 and 4 goes to "H" so that the two transistors 1 and 4 are turned on. At this time, if the signal Ext. $\overline{CAS}$ is at "H", the MOS transistors 2 and 5 are also turned on and the voltage at the node A and that at the node C are both brought into "L". Subsequently, when the signal Ext. $\overline{CAS}$ goes to "L", the MOS transistors 2 and 5 are both turned off and the voltage at the nodes A and C rises up to "H". In other words, with the signal RAS at "H", the output signal CAS1 from the CAS buffer circuit CB1 is a signal synchronizing with Ext. $\overline{CAS}$ but having the inverted phase against Ext. $\overline{CAS}$. Consequently, the signal $\overline{CAS1}$ generated according to a trigger of CAS1 becomes a signal synchronizing with the signal Ext, $\overline{CAS}$ and having the same phase as that of Ext. $\overline{CAS}$. Since the signals CAS1 and $\overline{CAS1}$ control the operation of the shift register SR and the output buffer circuit OB, these circuits are repeatedly operated and reset in synchronism with the signal Ext. $\overline{CAS}$.

The output signal $\overline{CASC}$ from the page/nibble switching signal generating circuit PN falls to "L" in accordance with the change of the input signal CAS1 to "H" (i.e., the change of the signal Ext. $\overline{CAS}$ to "L") and rises to "H" with the change of the signal $\overline{RAS}$ from the RAS buffer circuit RB to "H" (the change of Ext. $\overline{RAS}$ to "H") serving as a trigger, as shown in FIGS. 4 and 6.

As can be seen from FIGS. 5 and 6, the operation mode designating signal $\overline{NM}$ from the page/nibble switching signal generating circuit PN becomes a signal synchronizing with the signal Ext. $\overline{NM}$ under the condition of the RAS being at "H".

As shown in FIGS. 3A and 3B, the first stage of the second CAS buffer circuit CB2 is constructed so as to invert the logical product of the signal Ext. $\overline{CAS}$ and the output obtained as a logical sum of $\overline{NM}$ and $\overline{CASC}$. The timing of the output signal CAS2 of the CAS buffer circuit CB2 rising from "L" to "H" is determined by the turning off of the MOS transistors 12 and 15 (i.e., the change of Ext. $\overline{CAS}$ to "L") or the turning off of the MOS transistors 21 and 23 and the MOS transistors 22 and 24 (the change of $\overline{NM}$ and $\overline{CASC}$ to "L"). As a result, at the time of taking a column address in the common mode or in the page mode or in the first address of the nibble mode, at least either $\overline{CASC}$ or $\overline{NM}$ is at "H", and then CAS2 rises from "L" to "H" with the change of Ext. $\overline{CAS}$ to "L" as a trigger.

On the other hand, CAS2 goes to "L" in the case where simultaneously with the turning on of the MOS transistors 12 and 15 (the change of Ext. $\overline{CAS}$ to "H"), at least either the MOS transistors 21 and 22 or the MOS transistors 23 and 24 are turned on (at least either $\overline{NM}$ or $\overline{CASC}$ is at "H"). Consequently, since at least either $\overline{NM}$ or $\overline{CASC}$ is at "H" in the common mode and in the page mode, the signal CAS2 goes to "L" at the time when the signal Ext. $\overline{CAS}$ goes to "H". The page mode shown in FIG. 6 represents a case in which Ext. $\overline{NM}$ rises from "L" to "H" with a delay from Ext. $\overline{CAS}$. In this case, the signal CAS2 goes to "L" with the rise of $\overline{NM}$ to "H" as a trigger. The signal $\overline{CAS2}$ is generated by a trigger of CAS2. Accordingly, in the period of the nibble mode where $\overline{NM}$ and $\overline{CASC}$ are both at "L", both of CAS2 and $\overline{CAS2}$ remain unchanged and are maintained in a fixed state independent of the state of Ext. $\overline{CAS}$.

However, in the page mode where $\overline{NM}$ is at "H" and in the common mode where $\overline{CASC}$ is at "H", the signals CAS2 and $\overline{CAS2}$ both change their levels, synchronizing with the signal Ext. $\overline{CAS}$.

The signal CAS2 controls generation of a column address (CAS2 being applied to the address buffer circuits A0 to A7 and the outputs of the six address buffer circuits A0 to A5 being applied to the column decoder CD) and also controls start of operation of the data registers DR1 to DR4 for maintaining the selected data upon receipt of the signals from the column decoder. The signal $\overline{CAS2}$ serves to reset the column decoder CD and the data registers DR1 to DR4.

In the nibble mode, Ext. $\overline{NM}$ is at "L" and both of CAS2 and $\overline{CAS2}$ remain unchanged and therefore, the data registers DR1 to DR4 and the column decoder CD are held in the state established at that time. In this case, since CAS1 is generated in synchronism with Ext. $\overline{CAS}$, the data selectors DS1 to DS4 and the output buffer circuit OB operate according to the change of CAS1. Thus, the data bits stored in the data registers DR1 to DR4 are selected in response to the signals from the address buffer circuits A6 and A7 and are successively read out of the output buffer circuit OB.

On the other hand, in the page mode where Ext. $\overline{NM}$ is at "H", CAS2 goes to "L" if Ext. $\overline{CAS}$ is at "H". Consequently, the data registers DR1 to DR4, the column decoder CD, the address buffer circuits A0 to A7 as well as the data selectors DS1 to DS4 and the output buffer circuit OB are all reset and a new column address can be entered according to the change of Ext. $\overline{CAS}$, whereby page mode operation can be performed. Writing of data can be made by using an input buffer circuit instead of the output buffer circuit, causing the data to flow in the opposite direction.

Accordingly, if Ext. $\overline{NM}$ is fixed at "L", a semiconductor memory device having a nibble mode function can be obtained and if Ext. $\overline{NM}$ is fixed at "H", a semiconductor memory device having a page mode function can be obtained.

If Ext. $\overline{NM}$ is changed with suitable timing, it is made possible to perform page/nibble mode (continual nibble mode) operation in which the first address in the nibble mode (a column address in the nibble mode) is changed in the page mode, which results in remarkable improvement of the data rate.

Although in the above embodiment, a 64K bit dynamic RAM was described as an example, it is the same with other dynamic RAM such as a 256K bit dynamic RAM.

Thus, the present invention makes it possible to perform nibble mode operation and page mode operation in the same semiconductor memory device and to perform continual nibble mode operation in which the nibble mode and the page mode are selected alternately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of storing means arranged in matrix of a plurality of rows and a plurality of columns for storing data, comprising:
   first designating means providing data for designating a row to be selected from said plurality of rows and first selecting means for selecting a corresponding row upon receipt of the row designating data from said first designating means;
   second designating means providing data for designating a column to be selected from said plurality of columns and second selecting means for selecting a corresponding column upon receipt of the column designating data from said second designating means;
   means for temporarily storing either the data stored in the storing means selected by said first and second selecting means or the data to be stored;
   means to selectively read or write the data temporarily stored in said temporarily storing means;
   means for generating a first operation timing signal and first control means for controlling the operation of said first designating means upon receipt of said first operation timing signal from said first operation timing signal generating means,
   said semiconductor memory device having operation modes including a first mode and a second mode, and further comprising:
   means for generating a second operation timing signal;
   second control means for controlling the operation timing of said read or write means upon receipt of the second operation timing signal applied from said second operation timing signal generating means;
   means for generating an operation mode designating signal for designating said first or second operation mode;
   first signal generating means for generating a signal synchronized with and having the same phase as that of said operation mode designating signal upon receipt of said operation mode designating signal from said operation mode designating signal generating means and the signal from said first control means;
   second signal generating means for generating a signal changing from a first state to a second state in synchronism with the signal from said first control means and changing from said second state to said first state in synchronism with the signal from said second control means upon receipt of the signals from said first and second control means; and third control means for controlling the operation timing of said second designating means, said second selecting means, said data maintaining means and said selected data reading means, upon receipt of the signals from said first and second signal generating means, said semiconductor memory device being operable in either said first operation mode or said second operation mode in response to said operation mode designating signal.

2. A semiconductor memory device as set forth in claim 1, wherein said first operation mode is the page mode and said second operation mode is the nibble mode.

3. A semiconductor memory device as set forth in claim 1, wherein
said third control means comprises: means for receiving the signal from said first signal generating means and the signal from said second signal generating means to obtain a logical sum of said signals; and means for receiving said second operation timing signal and the signal from said logical sum means to obtain a logical product thereof and to invert the signals constituting the logical product.

* * * * *